(12) United States Patent
Presti (10) Patent No.: US 9,331,720 B2
(45) Date of Patent: May 3, 2016

(54) COMBINED DIRECTIONAL COUPLER AND IMPEDANCE MATCHING CIRCUIT

(75) Inventor: Calogero D. Presti, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 493 days.

(21) Appl. No.: 13/361,854

(22) Filed: Jan. 30, 2012

(65) Prior Publication Data

US 2013/0194054 A1    Aug. 1, 2013

(51) Int. Cl.
  *H03H 7/38*   (2006.01)
  *H01P 5/18*   (2006.01)
  *H04B 1/04*   (2006.01)
(52) U.S. Cl.
  CPC .................... *H04B 1/0458* (2013.01)
(58) Field of Classification Search
  CPC .................... H01P 5/18; H03H 7/38
  USPC .............. 333/109, 110, 111, 112, 116, 117
  See application file for complete search history.

(56) References Cited

U.S. PATENT DOCUMENTS

| | | | |
|---|---|---|---|
| 5,625,328 A * | 4/1997 | Coleman, Jr. ................. | 333/116 |
| 7,005,940 B2 | 2/2006 | Kodim | |
| 7,863,998 B2 * | 1/2011 | Rofougaran ..................... | 333/25 |
| 8,315,576 B2 * | 11/2012 | Jones ............................. | 455/78 |
| 2009/0212887 A1 * | 8/2009 | Rofougaran ................ | 333/24 R |
| 2009/0289717 A1 * | 11/2009 | Tanaka et al. ................. | 330/277 |
| 2010/0093293 A1 | 4/2010 | Grebennikov et al. | |
| 2010/0291888 A1 | 11/2010 | Hadjichristos et al. | |
| 2011/0037516 A1 | 2/2011 | Nejati et al. | |
| 2011/0063044 A1 * | 3/2011 | Jones ............................. | 333/109 |
| 2011/0255575 A1 | 10/2011 | Zhu et al. | |
| 2011/0267194 A1 * | 11/2011 | Hong et al. ................ | 340/572.7 |

FOREIGN PATENT DOCUMENTS

| | | |
|---|---|---|
| CN | 101908881 A | 12/2010 |
| EP | 1355432 A1 | 10/2003 |
| EP | 1732231 A2 | 12/2006 |
| JP | 2000138546 A | 5/2000 |
| WO | WO2006018444 A1 | 2/2006 |

OTHER PUBLICATIONS

International Search Report and Written Opinion—PCT/US2013/023936—ISA/EPO—Apr. 18, 2013.

* cited by examiner

*Primary Examiner* — Dean Takaoka
(74) *Attorney, Agent, or Firm* — James Gutierrez (57) ABSTRACT

An output circuit with an integrated directional coupler and impedance matching circuit is disclosed. In an exemplary design, an apparatus includes a switchplexer and an output circuit. The switchplexer is coupled to at least one power amplifier. The output circuit is coupled to the switchplexer and a load (e.g., an antenna) and includes a directional coupler and an impedance matching circuit sharing at least one inductor. The output circuit performs impedance matching for the load. The output circuit also acts as a directional coupler and provides an input radio frequency (RF) signal as an output RF signal and further couples a portion of the input RF signal as a coupled RF signal. Reusing the at least one inductor for both the directional coupler and the impedance matching circuit may reduce circuitry, size, and cost of the wireless device and may also improve performance.

19 Claims, 11 Drawing Sheets

COMBINED DIRECTIONAL COUPLER AND IMPEDANCE MATCHING CIRCUIT

BACKGROUND

I. Field

The present disclosure relates generally to electronics, and more specifically to a wireless device.

II. Background

A wireless device (e.g., a cellular phone or a smart phone) may include a transmitter and a receiver coupled to an antenna to support two-way communication. For data transmission, the transmitter may modulate a radio frequency (RF) carrier signal with data to obtain a modulated RF signal, amplify the modulated RF signal to obtain an output RF signal having the proper output power level, and transmit the output RF signal via the antenna to a base station. For data reception, the receiver may obtain a received RF signal via the antenna and may condition and process the received RF signal to recover data sent by the base station.

A wireless device may include one or more transmitters and one or more receivers coupled to one or more antennas. It is desirable to implement the transmitters and receivers to achieve good performance while reducing circuitry and cost.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

A wireless device comprising an output circuit having an integrated/combined directional coupler and impedance matching circuit is described herein. A directional coupler is a circuit that receives an input signal at a first port, passes most of the input signal to a second port, and couples a portion of the input signal to a third port. The directional coupler may also receive a reflected signal at the second port and couples a portion of the reflected signal to a fourth port. An impedance matching circuit is a circuit that matches an output impedance of a first circuit (e.g., an amplifier) to an input impedance of a second circuit (e.g., an antenna). An impedance matching circuit may also be referred to as a matching circuit, a tuning circuit, etc. Integrating/combining the directional coupler and the impedance matching circuit may reduce circuitry, size, and cost and may also improve the performance of the wireless device.

Figure 1:
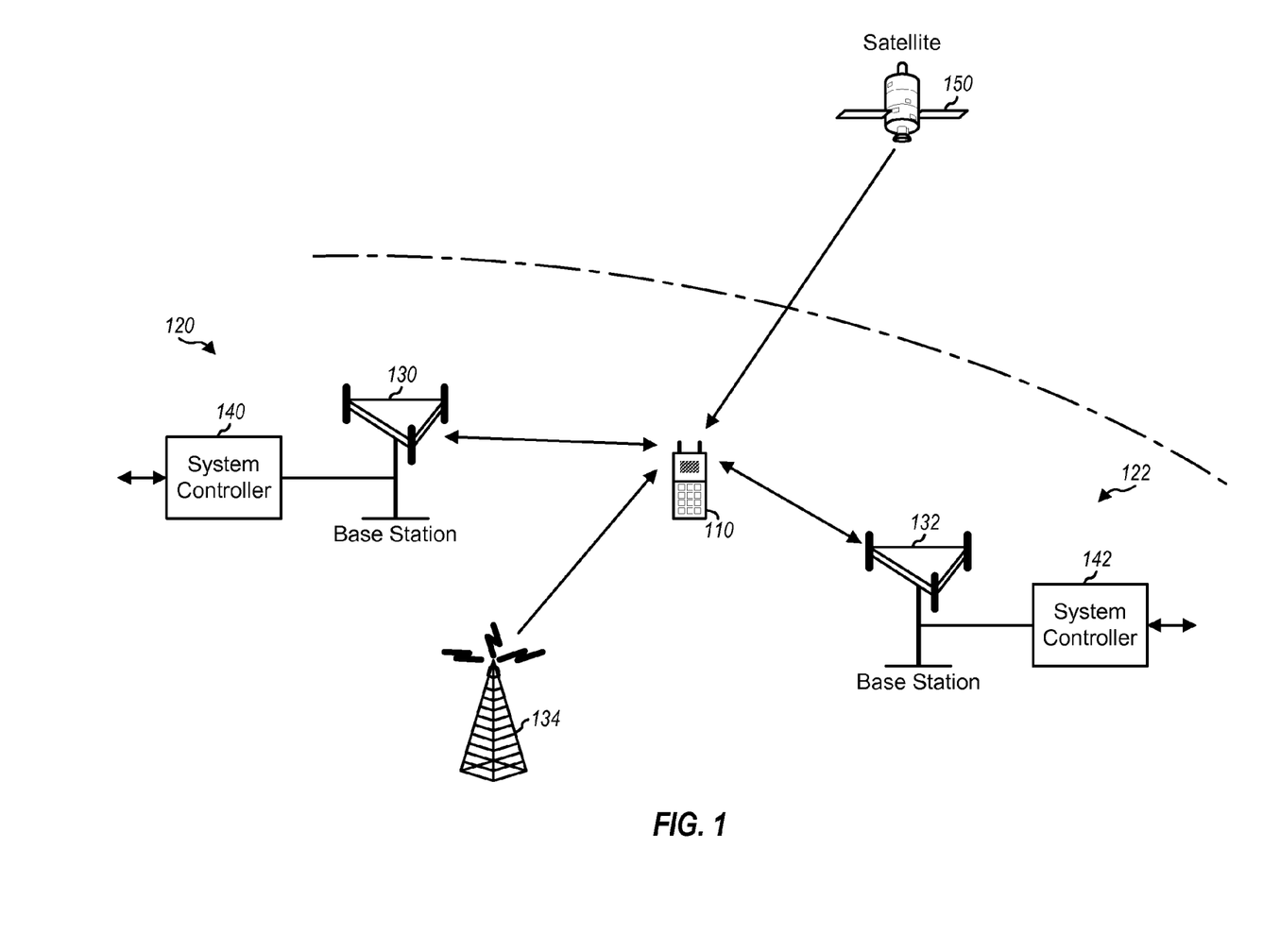
FIG. 1 shows a wireless device capable of communicating with different wireless communication systems.

FIG. 1 shows a wireless device 110 capable of communicating with different wireless communication systems 120 and 122. Wireless systems 120 and 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), cdma2000, or some other version of CDMA. For simplicity, FIG. 1 shows wireless system 120 including one base station 130 and one system controller 140, and wireless system 122 including one base station 132 and one system controller 142. In general, each wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smart phone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134). Wireless device 110 may also be capable of receiving signals from satellites (e.g., a satellite 150) in one or more global navigation satellite systems (GNSS). Wireless device 110 may support one or more radio technologies for wireless communication such as LTE, cdma2000, WCDMA, GSM, 802.11, etc.

Figure 2:
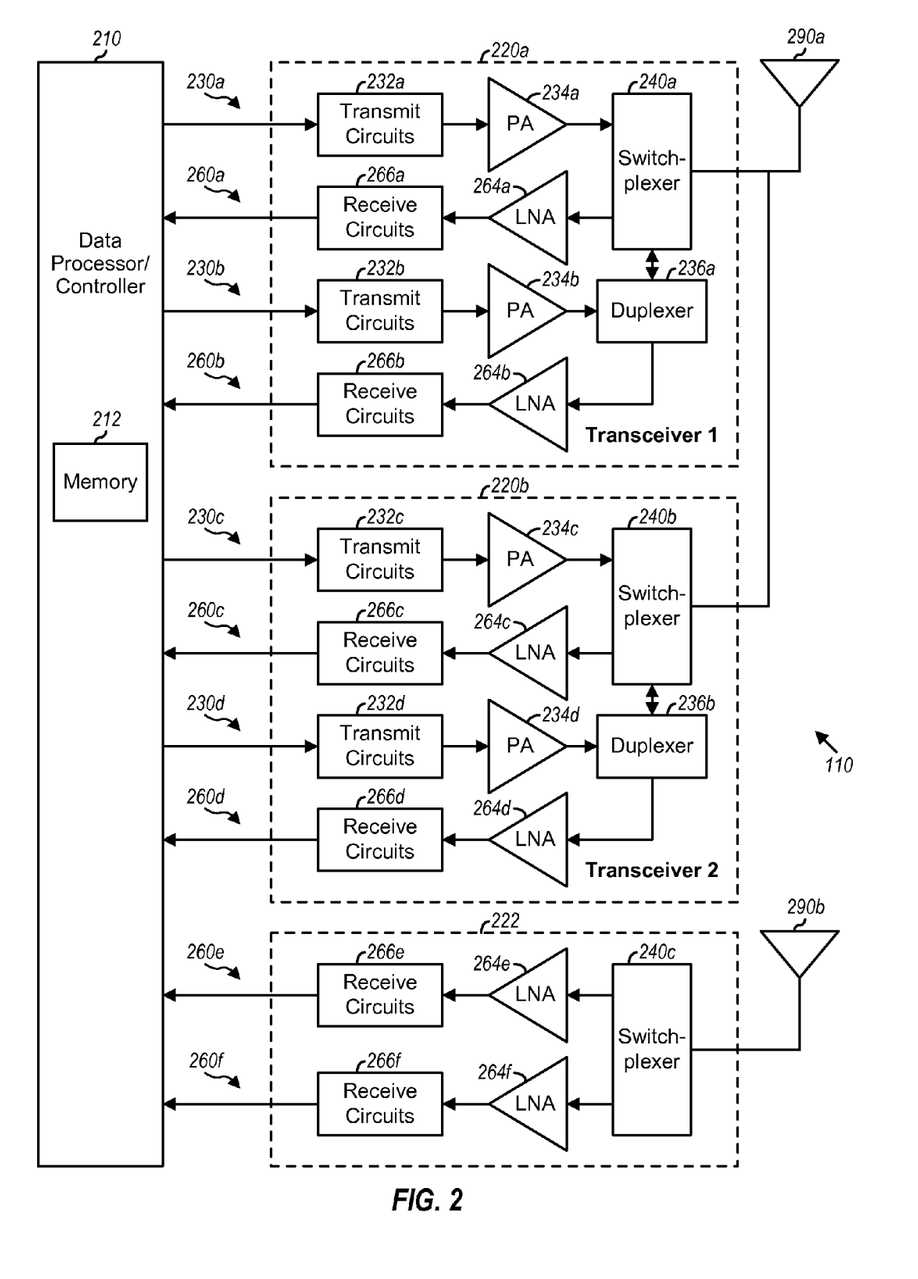
FIG. 2 shows a block diagram of a wireless device.

FIG. 2 shows a block diagram of an exemplary design of wireless device 110 in FIG. 1. In this exemplary design, wireless device 110 includes a data processor/controller 210, two transceivers 220a and 220b coupled to a primary antenna 290a, and receivers 222 coupled to a secondary/diversity antenna 290b. Transceiver 220a support high frequency band (or high band), transceiver 220b supports low frequency band (or low band), and receivers 222 support receive diversity. In general, a wireless device may include any number of transceivers, any number of receivers, and any number of antennas. Multiple transceivers may be used to support different frequency bands, different radio technologies, multiple-input multiple-output (MIMO), transmit and/or receive diversity, carrier aggregation, etc.

In the exemplary design shown in FIG. 2, transceiver 220a includes two transmitters 230a and 230b and two receivers 260a and 260b. Transceiver 220b includes two transmitters 230c and 230d and two receivers 260c and 260d. Receivers 222 include two receivers 260e and 260f. In general, a transceiver may include any number of transmitters and any number of receivers to support wireless communication on any number of frequency bands, any number of radio technologies, etc. Any number of receivers may also be used to support different frequency bands, different radio technologies, etc.

In the exemplary design shown in FIG. 2, within transceiver 220a, transmitter 230a includes transmit circuits 232a and a power amplifier (PA) 234a. Receiver 260a includes a low noise amplifier (LNA) 264a and receive circuits 266a. Transmitter 230b includes transmit circuits 232b, a PA 234b, and a duplexer 236a. Receiver 260b includes duplexer 236a, an LNA 264b, and receive circuits 266b. A switchplexer 240a is coupled to PA 234a, LNA 264a, and duplexer 236a and also to antenna 290a. A switchplexer may also be referred to as an antenna switch module (ASM), a switch module, switches, etc.

Within transceiver 220b, transmitter 230c includes transmit circuits 232c and a PA 234c, receiver 260c includes an LNA 264c and receive circuits 266c, transmitter 230d includes transmit circuits 232d, a PA 234d, and a duplexer 236b, and receiver 260d includes duplexer 236b, an LNA 264d, and receive circuits 266d. A switchplexer 240b is coupled to PA 234c, LNA 264c, and duplexer 236b and also to antenna 290b.

Within receivers 222, receiver 260e includes an LNA 264e and receive circuits 266e, and receiver 260f includes an LNA 264f and receive circuits 266f. A switchplexer 240c is coupled to LNAs 264c and 264d and also to antenna 290b.

For data transmission, data processor 210 processes (e.g., encodes and modulates) data to be transmitted and provides an analog output signal to a selected transmitter. The description below assumes that transmitter 230b is the selected transmitter. Within transmitter 230b, transmit circuits 232b amplify, filter, and upconvert the analog output signal from baseband to RF and provide a modulated RF signal. Transmit circuits 232b may include amplifiers, filters, mixers, an oscillator, a local oscillator (LO) generator, a phase locked loop (PLL), etc. PA 234b receives and amplifies the modulated RF signal and provides an amplified RF signal having the proper output power level. The amplified RF signal is passed through duplexer 236a, further routed through switchplexer 240a, and transmitted via antenna 290a. Duplexer 236a includes a transmit filter and a receive filter. The transmit filter may filter the amplified RF signal from PA 234b to pass desired signal components in a transmit band and attenuate undesired signal components in a receive band.

For data reception, antenna 290a receives signals from base stations and/or other transmitter stations and provides a received RF signal, which is routed through switchplexer 240a and provided to a selected receiver. The description below assumes that receiver 260b is the selected receiver. Within receiver 260b, the receive filter within duplexer 236a filters the received RF signal to pass desired signal components in the receive band and attenuate undesired signal components in the transmit band. LNA 264b amplifies a filtered RF signal from duplexer 240a and provides a receiver input RF signal. Receive circuits 266b amplify, filter, and downconvert the receiver RF input signal from RF to baseband and provide an analog input signal to data processor 210. Receive circuits 266b may include amplifiers, filters, mixers, an oscillator, an LO generator, a PLL, etc.

FIG. 2 shows an exemplary design of transmitters 230 and receivers 260. A transmitter and a receiver may also include other circuits not shown in FIG. 2, such as filters, impedance matching circuits, etc. All or a portion of transceivers 220a and 220b and receivers 222 may be implemented on one or more analog integrated circuits (ICs), RF ICs (RFICs), mixed-signal ICs, etc. For example, transmit circuits 232, PAs 234, LNAs 264, and receive circuits 266 may be implemented on an RFIC. PAs 234 and possibly other circuits may also be implemented on a separate IC or module.

Data processor/controller 210 may perform various functions for wireless device 110. For example, data processor 210 may perform processing for data being transmitted via transmitters 230 and received via receivers 260. Controller 210 may control the operation of transmit circuits 232, receive circuits 266, switchplexers 240, etc. A memory 212 may store program codes and data for data processor/controller 210. Data processor/controller 210 may be implemented on one or more application specific integrated circuits (ASICs) and/or other ICs.

As shown in FIG. 2, a switchplexer may be coupled between an antenna and other circuits such as PAs, duplexers, etc. The switchplexer may include switches, which may be implemented with semiconductor transistors such as metal oxide semiconductor (MOS) transistors. The switchplexer may appear capacitive, e.g., due to parasitic capacitances of the MOS transistors used to implement the switches. The capacitive switchplexer may degrade performance.

Figure 3:
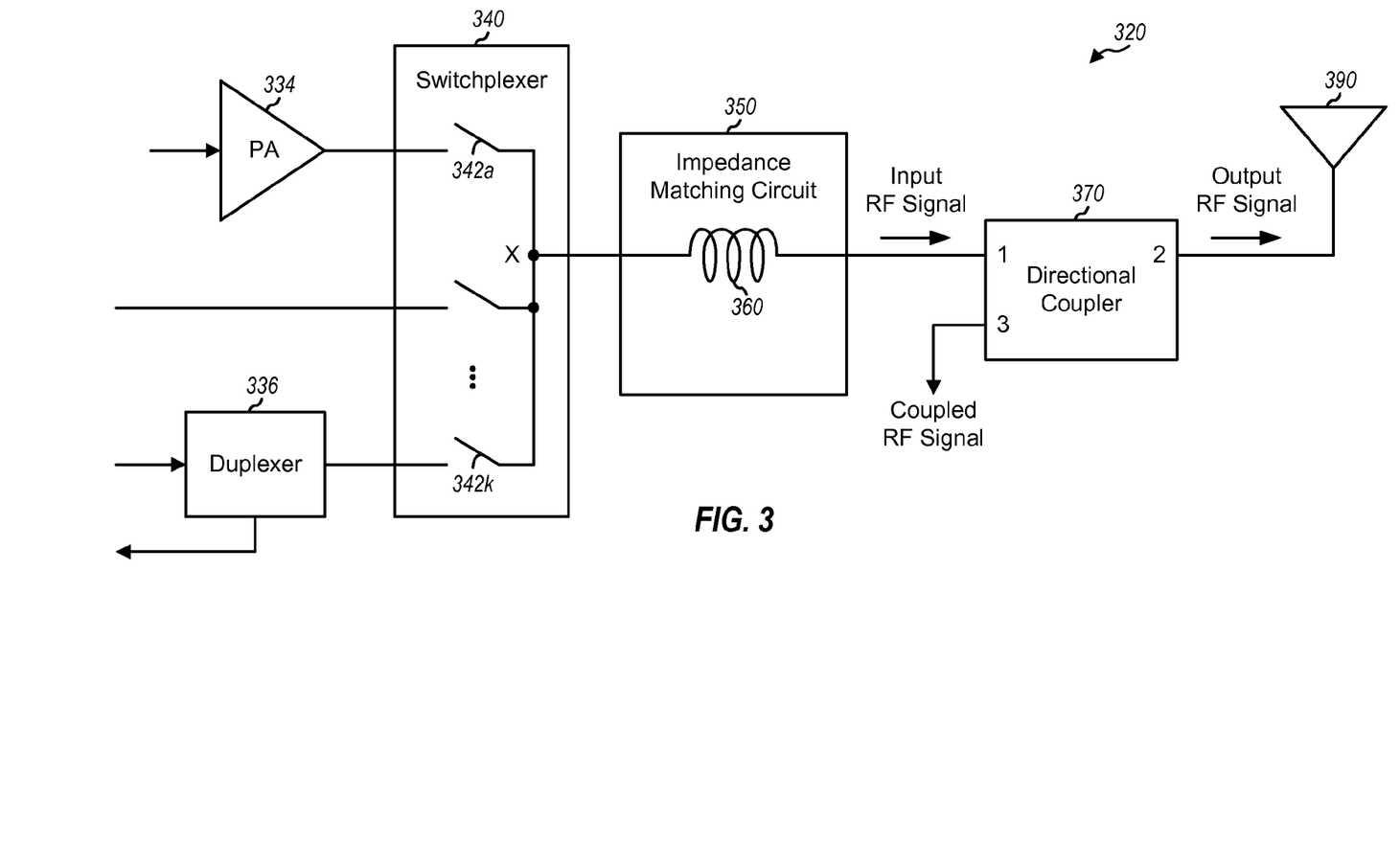
FIG. 3 shows a block diagram of a transceiver.

FIG. 3 shows an exemplary design of a portion of a transceiver 320 with impedance matching to mitigate the effects of a capacitive switchplexer. Transceiver 320 includes a PA 334 and a duplexer 336 coupled to a switchplexer 340. Switchplexer 340 includes a switch 342a coupled between PA 334 and node X, a switch 342k coupled between duplexer 336 and node X, and possibly additional switches. Transceiver 320 may also include additional PAs, duplexers, LNAs, etc. coupled to switchplexer 340, which are not shown in FIG. 3 for simplicity.

Node X is an output of switchplexer 340. An impedance matching circuit 350 is coupled to the output of switchplexer 340 and includes an inductor 360. Inductor 360 is coupled between an input and an output of matching circuit 350 and in series with switchplexer 340. A capacitor may be coupled between the output of matching circuit 350 and circuit ground (not shown in FIG. 3). A directional coupler 370 is coupled between matching circuit 350 and an antenna 390.

Switchplexer 340 may include a switch for each PA and each duplexer coupled to its inputs and may appear capacitive. Series inductor 360 is coupled between switchplexer 340 and antenna 390 and is used to match the impedance of switchplexer 340. The improved impedance matching may reduce insertion loss of switchplexer 340. Matching circuit 350 may also act as a lowpass filter for the amplified RF signal from PA 334. Directional coupler 370 is placed between switchplexer 340 and antenna 390 and is used to detect incident power of an input RF signal at port 1, which may include (i) the amplified RF signal provided by PA 334 to antenna 390 when PA 334 is enabled and all other PAs are disabled and/or (ii) other signals from other sources connected to switchplexer 340. Certain advantages may be obtained by placing directional coupler 370 closer to antenna 390, as shown in FIG. 3. For example, placing directional coupler 370 closer to antenna 390 may enable self-calibration, improve control of total radiated power, and/or provide other advantages.

Matching circuit 350 and directional coupler 370 may add to the total insertion loss of the transmit path from PA 334 to antenna 390. In particular, the total insertion loss may be equal to the sum of the loss of switchplexer 340, the loss of matching circuit 350 (e.g., the loss of inductor 360), the loss of directional coupler 370, and the loss of routing traces between these circuits. Matching circuit 350 and directional coupler 370 may also increase circuitry, size, and cost of transceiver 320.

Figure 4A:
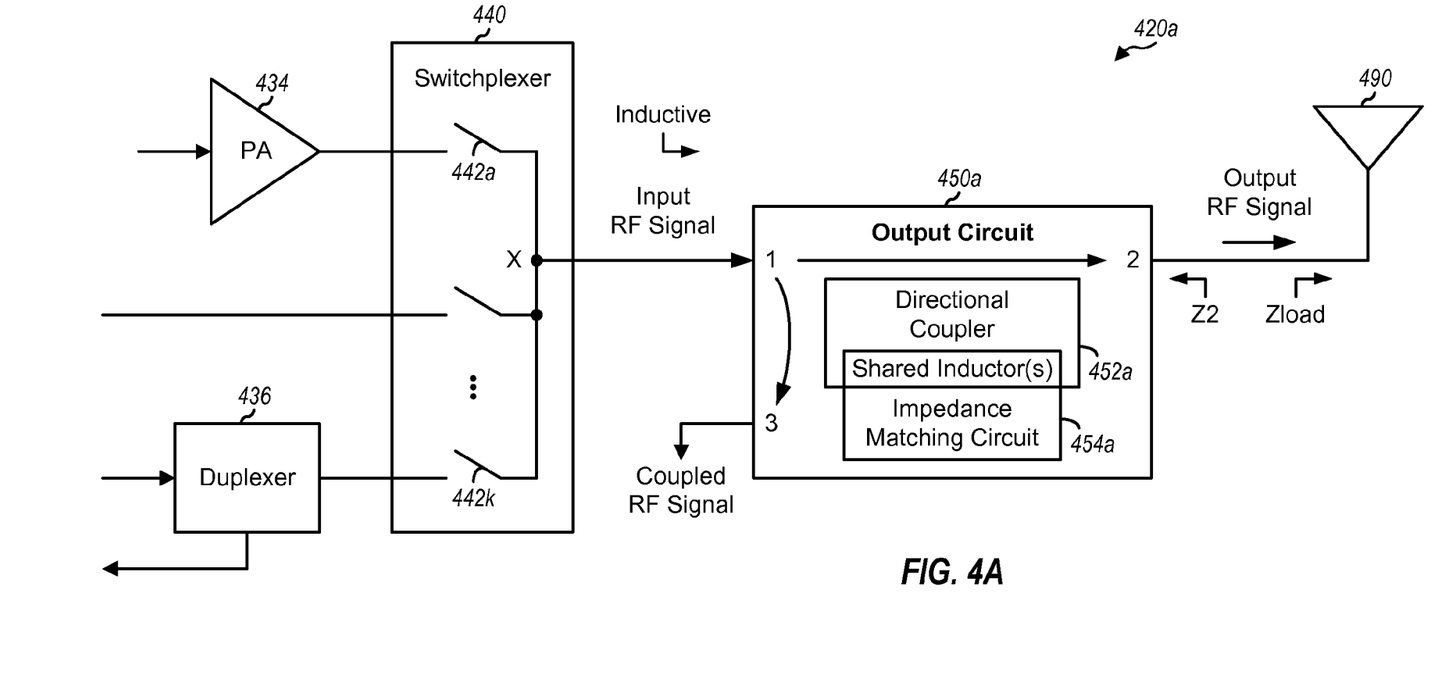
FIGS. 4A, 4B and 4C show three exemplary designs of a transceiver with a 3-port output circuit comprising an integrated/combined directional coupler and impedance matching circuit.

FIG. 4A shows an exemplary design of a transceiver 420a with a 3-port output circuit 450a comprising a directional coupler 452a and an impedance matching circuit 454a that are integrated/combined. Transceiver 420a includes a PA 434 and a duplexer 436 coupled to a switchplexer 440. Switchplexer 440 includes a switch 442a coupled between PA 434 and node X, a switch 442k coupled between duplexer 436 and node X, and possibly additional switches. In general, switchplexer 440 may be coupled to any number of PAs, duplexers, and/or other circuits and may include any number of switches. For example, switchplexer 440 may include K switches coupled to K PAs or a combination of K PAs, LNAs, duplexers, etc., where K may be any integer value greater than one.

Output circuit 450a has a first/input port denoted as port 1, a second/output port denoted as port 2, and a third/coupled port denoted as port 3. Output circuit 450a has (i) its port 1 coupled to node X of switchplexer 440 and receiving an input RF signal, which may comprise the amplified RF signal from PA 434, (ii) its port 2 coupled to an antenna 490 and providing an output RF signal, and (iii) its port 3 providing a coupled RF signal. Output circuit 450a comprises directional coupler 452a that (i) couples most of the input RF signal from port 1 to port 2, (ii) couples a small portion (e.g., an amplitude ratio of approximately 1/10) of the input RF signal from port 1 to port 3, (iii) couples a smaller portion (e.g., an amplitude ratio of approximately 1/100 or less) of the input RF signal to an internal resistor, (iv) couples a small portion (e.g., an amplitude ratio of approximately 1/10) of an RF signal reflected by load 490 to an internal resistor, and (v) couples a smaller portion (e.g., an amplitude ratio of approximately 1/100 or less) of the RF signal reflected by the load 490 to port 3. For example, directional coupler 452a may have $S(2,1)$ of approximately −0.1 dB, $S(3,1)$ of approximately −20 dB, $S(4,1)$ of approximately −40 dB, $S(3,2)$ of approximately −40 dB, and $S(4,2)$ of approximately −20 dB, where port 4 is the internal resistor. Output circuit 450a also comprises impedance matching circuit 454a that can mitigate the capacitive nature of switchplexer 440. Output circuit 450a may appear inductive looking into port 1 in order to combat the capacitive switchplexer 440.

Directional coupler 452a within output circuit 450a has a reflection coefficient of $S(1,1)$ at port 1. The reflection coefficient is a ratio of the amplitude of a reflected signal over the amplitude of an incident signal. The reflection coefficient is measured at port 1 with the remaining ports 2 and 3 being terminated with a reference impedance, which may be 50 Ohms, 75 Ohms, or some other impedance. For example, the reference impedance may be the impedance of antenna 490. The reflection coefficient at port 1 of directional coupler 452a is typically not close to zero and instead has a positive imaginary part, so that output circuit 450a appears inductive looking into port 1 and can perform impedance matching for switchplexer 440. In an exemplary design, output circuit 450a is designed such that, with switchplexer 440 connected at port 1, the impedance looking into port 2 (which is denoted as Z2 in FIG. 4A) is close to the reference impedance at a target operating frequency. Hence, output circuit 450a may be designed such that its port 2 is well matched at the operating frequency.

As shown in FIG. 4A, directional coupler 452a and impedance matching circuit 454a may be integrated/combined in output circuit 450a. Impedance matching circuit 454a may include an inductor to improve impedance matching for switchplexer 440. The integration would enable directional coupler 452a to reuse the inductor in impedance matching circuit 454a, so that both circuits can share the same inductor. The integration may reduce circuitry, size, and cost of a wireless device and may also improve performance. Output circuit 450a may be located between switchplexer 440 and antenna 490 and may perform both impedance matching for switchplexer 440 and directional coupling to detect incident power.

In general, directional coupler 452a and impedance matching circuit 454a may share one or more inductors. The shared inductor(s) are represented by a rectangular block for directional coupler 452a partially overlapping a rectangular block for impedance matching circuit 454a in FIG. 4A. In one exemplary design, directional coupler 452a may include one or more circuit components that are not part of impedance matching circuit 454a, which is represented by part of the rectangular block for directional coupler 452a being outside of the rectangular block for impedance matching circuit 454a in FIG. 4A. Similarly, impedance matching circuit 454a may include one or more circuit components that are not part of directional coupler 452a, which is represented by part of the rectangular block for impedance matching circuit 454a being outside of the rectangular block for directional coupler 452a in FIG. 4A. In another design, directional coupler 452a includes all circuit components of impedance matching circuit 454a, which may be represented by the rectangular block of the impedance matching circuit being completely within the rectangular block for the directional coupler (not shown in FIG. 4A).

Figure 4B:
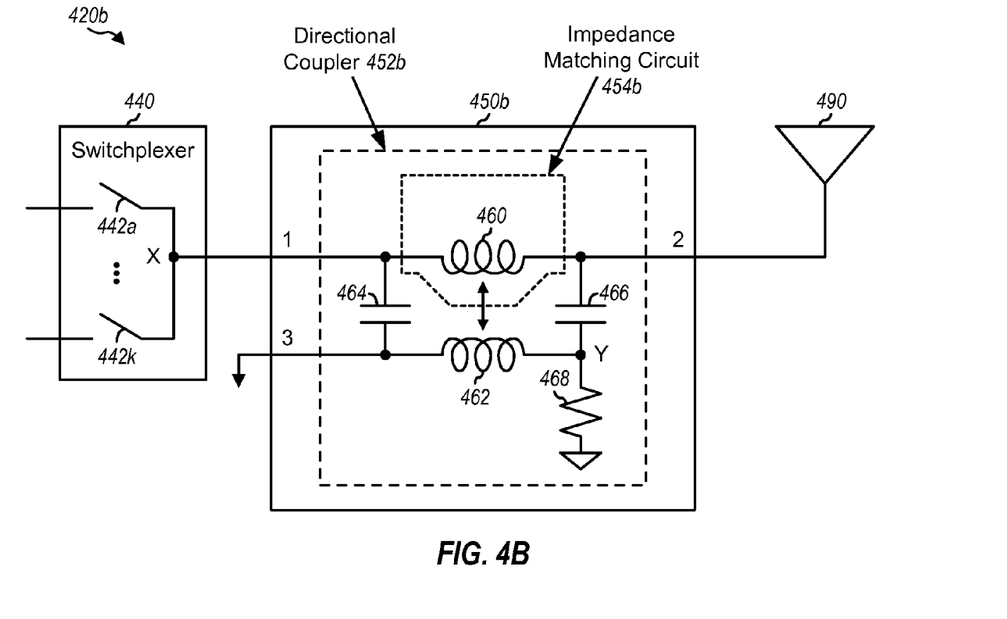

FIG. 4B shows a schematic diagram of a 3-port output circuit 450b, which is an exemplary design of output circuit 450a in FIG. 4A. Output circuit 450b includes a directional coupler 452b and an impedance matching circuit 454b sharing an inductor 460. Within output circuit 450b, inductor 460 is coupled between port 1 and port 2, and an inductor 462 is coupled between port 3 and node Y. A capacitor 464 is coupled between port 1 and port 3, and a capacitor 466 is coupled between port 2 and node Y. A resistor 468 is coupled between node Y and circuit ground.

In the exemplary design shown in FIG. 4B, directional coupler 452b is implemented with two inductors 460 and 462, two capacitors 464 and 466, and one resistor 468. Impedance matching circuit 454b is implemented with inductor 460, which corresponds to matching inductor 360 in FIG. 3. Inductor 460 is reused to implement both directional coupler 452b and impedance matching circuit 454b. Inductor 462 is magnetically coupled with inductor 460. Inductors 460 and 462 may be implemented on two layers or side-by-side on an IC or a circuit board to reduce space, as described below.

Figure 4C:
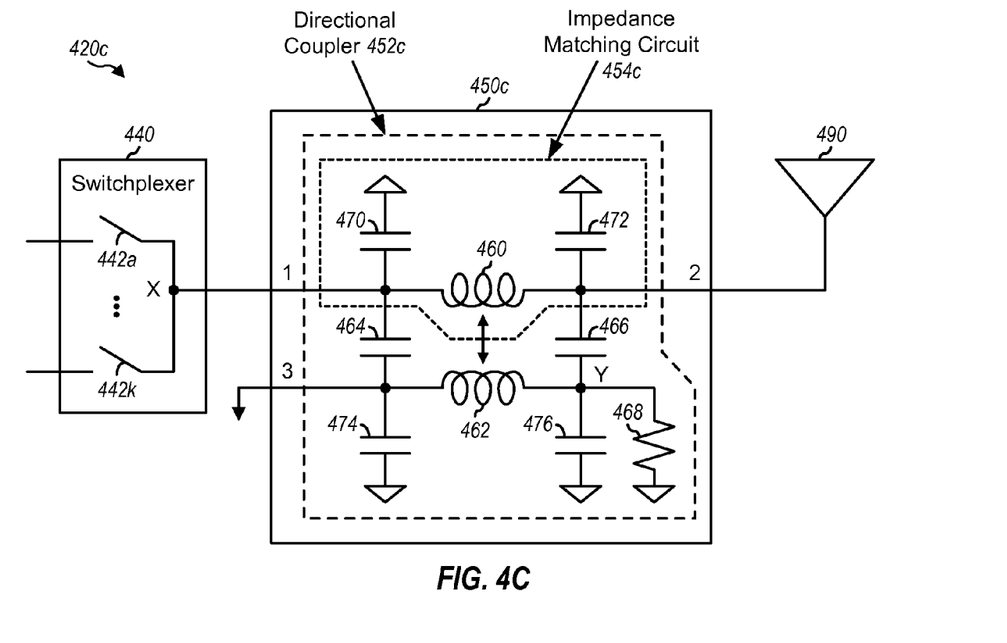

FIG. 4C shows a schematic diagram of a 3-port output circuit 450c, which is another exemplary design of output circuit 450a in FIG. 4A. Output circuit 450c includes a directional coupler 452c and an impedance matching circuit 454c sharing inductor 460. Output circuit 450c includes inductors 460 and 462, capacitors 464 and 466, and resistor 468, which are coupled as described above for FIG. 4B. Output circuit 450c further includes a capacitor 470 coupled between port 1 and circuit ground, a capacitor 472 coupled between port 2 and circuit ground, a capacitor 474 coupled between port 3 and circuit ground, and a capacitor 476 coupled between node Y and circuit ground.

In the exemplary design shown in FIG. 4C, directional coupler 452c is implemented with two inductors 460 and 462, six capacitors 464, 466, 470, 472, 474 and 476, and one resistor 468. Impedance matching circuit 454c is implemented with inductor 460 and two capacitors 470 and 472. Inductor 460 is reused to implement both directional coupler 452c and impedance matching circuit 454c.

In the exemplary design shown in FIG. 4C, a shunt capacitor is coupled between each port of output circuit 450c and circuit ground, and a shunt capacitor is coupled between node Y and circuit ground. In general, one or more shunt capacitors may be connected to one or more ports and/or node Y of output circuit 450c. The shunt capacitors together with inductor 460 may improve impedance matching for switchplexer 440. Capacitors 470 and 472 and inductor 460 may reduce the bandwidth of the impedance matching, e.g., in case insufficient attenuation is achieved at high frequency with only inductor 460 and capacitor 472. Capacitor 470 may add to the capacitance of switchplexer 440, which may make the matching circuit looks like a lowpass filter with a lower cutoff frequency. This lowpass filter may be desired when more attenuation is desired at harmonic frequencies. Capacitors 474 and 476 may improve S(3,3) transfer function and the impedance of port 3. Capacitors 474 and 476 may be especially useful when a good circuit ground is not available on the chip and circuit ground has some large parasitic inductance. A better S(3,3) may improve performance, especially when multiple directional couplers are connected in a daisy chain, e.g., with port 4 of a first directional coupler being connected to port 3 of a second directional coupler. The shunt capacitors may provide other advantages.

In the exemplary designs shown in FIGS. 4B and 4C, a directional coupler includes all circuit components of an impedance matching circuit. In another exemplary design, an impedance matching circuit may include one or more circuit components that are not part of a directional coupler.

Figure 5A:
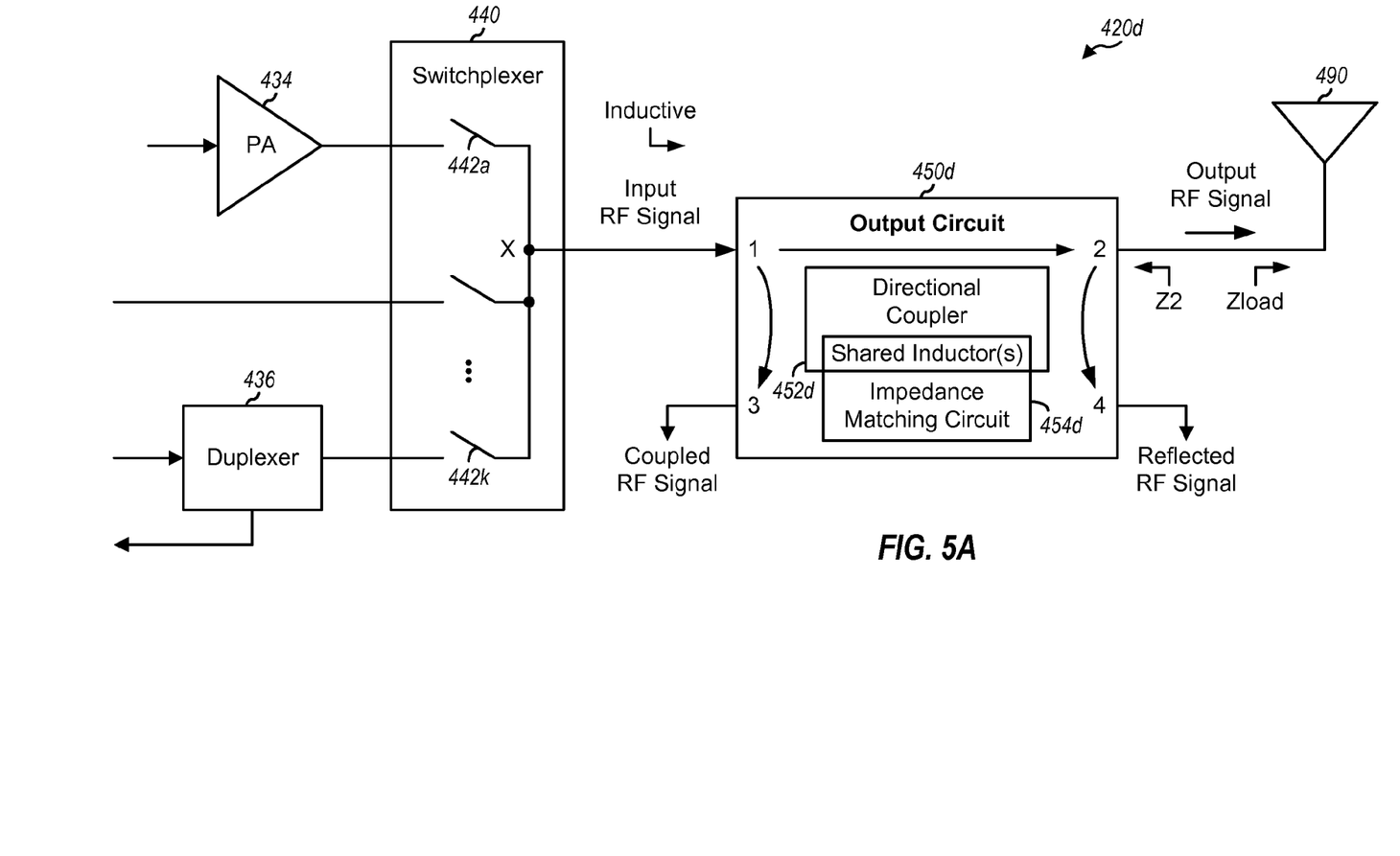
FIGS. 5A, 5B and 5C show three exemplary designs of a transceiver with a 4-port output circuit.

FIG. 5A shows an exemplary design of a transceiver 420d with a 4-port output circuit 450d comprising a directional coupler 452d and an impedance matching circuit 454d that are integrated/combined. Output circuit 450d has a first/input port denoted as port 1, a second/output port denoted as port 2, a third/coupled port denoted as port 3, and a fourth/isolated port denoted as port 4. Output circuit 450d has (i) its port 1 coupled to node X of switchplexer 440 and receiving an input RF signal, which may comprise the amplified RF signal from PA 434, (ii) its port 2 coupled to an antenna 490 and providing an output RF signal, (iii) its port 3 providing a coupled RF signal, and (iv) its port 4 providing a reflected RF signal. Output circuit 450d comprises directional coupler 452d that couples most of the input RF signal from port 1 to port 2, couples a small portion (e.g., an amplitude ratio of approximately 1/10) of the input RF signal from port 1 to port 3, and couples a smaller portion (e.g., an amplitude ratio of approximately 1/100 or less) of the input RF signal from port 1 to port 4. Directional coupler 452d also couples a small portion (e.g., an amplitude ratio of approximately 1/10) of the reflected signal due to antenna 490 from port 2 to port 4 and also couples a smaller portion (e.g., an amplitude ratio of approximately 1/100 or less) of the reflected signal from port 2 to port 3. Output circuit 450d also comprises impedance matching circuit 454d that can mitigate the capacitive nature of switchplexer 440. Output circuit 450d may appear inductive looking into port 1 in order to combat the capacitive switchplexer 440.

In an exemplary design, output circuit 450d is designed such that, with switchplexer 440 connected at port 1, the impedance at port 2 is close to a reference impedance when measured at a target operating frequency. Hence, output circuit 450d may be designed such that its port 2 is well matched at the operating frequency. Output circuit 450d may also be designed such that it appears inductive looking into port 1.

Figure 5B:
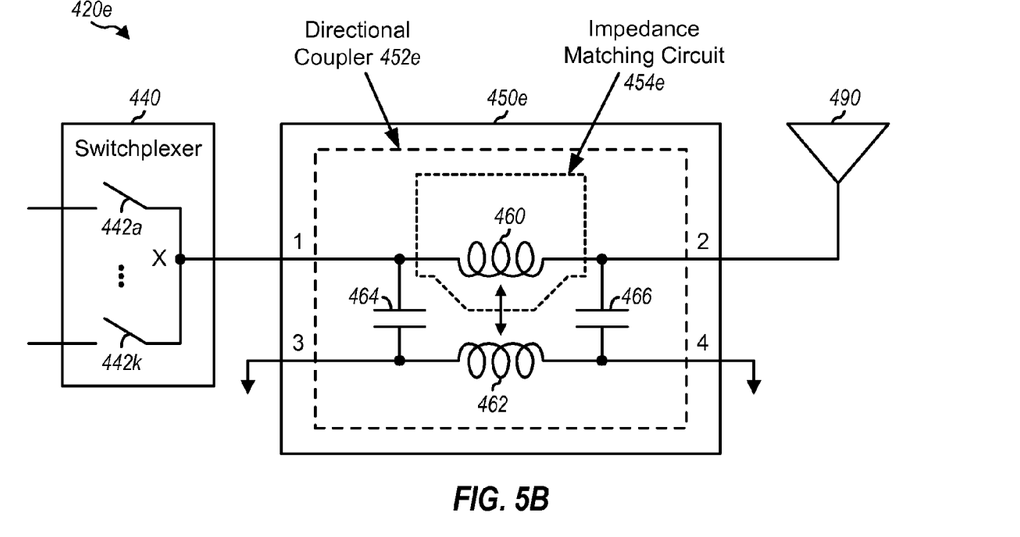

FIG. 5B shows a schematic diagram of a 4-port output circuit 450e, which is an exemplary design of output circuit 450d in FIG. 5A. Output circuit 450e includes a directional coupler 452e and an impedance matching circuit 454e sharing inductor 460. Within output circuit 450e, inductor 460 is coupled between port 1 and port 2, and inductor 462 is coupled between port 3 and port 4. Capacitor 464 is coupled between port 1 and port 3, and capacitor 466 is coupled between port 2 and port 4.

In the exemplary design shown in FIG. 5B, directional coupler 452e is implemented with two inductors 460 and 462 and two capacitors 464 and 466. Impedance matching circuit 454e is implemented with inductor 460, which corresponds to matching inductor 360 in FIG. 3. Inductor 460 is reused to implement both directional coupler 452e and impedance matching circuit 454e. Inductor 462 is magnetically coupled with inductor 460.

Figure 5C:
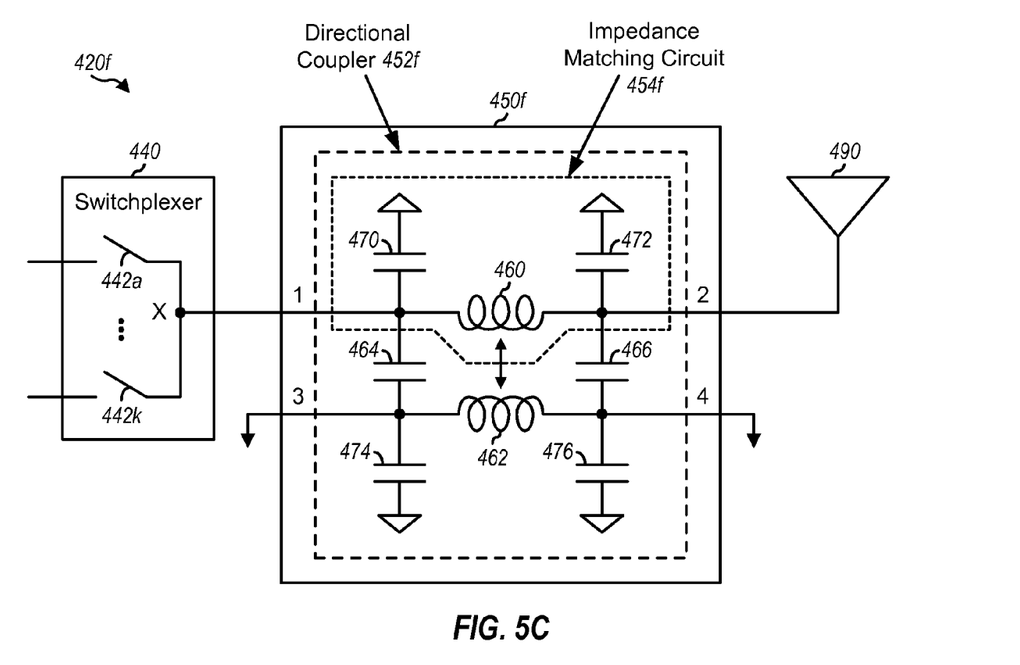

FIG. 5C shows a schematic diagram of a 4-port output circuit 450f, which is another exemplary design of output circuit 450d in FIG. 5A. Output circuit 450f includes a directional coupler 452f and an impedance matching circuit 454f sharing inductor 460. Output circuit 450f includes inductors 460 and 462 and capacitors 464 and 466, which are coupled as described above for FIG. 5B. Output circuit 450f further includes capacitor 470 coupled between port 1 and circuit ground, capacitor 472 coupled between port 2 and circuit ground, capacitor 474 coupled between port 3 and circuit ground, and capacitor 476 coupled between port 4 and circuit ground.

In the exemplary design shown in FIG. 5C, directional coupler 452f is implemented with two inductors 460 and 462 and six capacitors 464, 466, 470, 472, 474 and 476. Impedance matching circuit 454f is implemented with inductor 460 and two capacitors 470 and 472. Inductor 460 is reused to implement both directional coupler 452f and impedance matching circuit 454f.

In the exemplary design shown in FIG. 5C, a shunt capacitor is coupled between each port of output circuit 450f and circuit ground. In general, one or more shunt capacitors may be connected to one or more ports of output circuit 450f. The shunt capacitors may improve impedance matching for switchplexer 440 and/or provide other advantages.

In the exemplary designs shown in FIGS. 5B and 5C, a directional coupler includes all circuit components of an impedance matching circuit. In another exemplary design, an impedance matching circuit may include one or more circuit components that are not part of a directional coupler.

In an exemplary design, an output circuit may include fixed capacitors, e.g., as shown in FIGS. 4B, 4C, 5B and 5C. The capacitance values of these capacitors may be selected to provide good performance at a target operating frequency.

In another exemplary design, an output circuit may include one or more adjustable capacitors. For example, one or more of capacitors 464 to 476 in FIGS. 4B, 4C, 5B and 5C may be adjustable. An adjustable capacitor may be implemented with a variable capacitor (varactor) having a capacitance that can be adjusted based on an analog control voltage. An adjustable capacitor may also be implemented with a bank of capacitors that can be selected or unselected to change capacitance. In any case, the adjustable capacitor(s) in an output circuit may be varied to improve impedance matching and obtain good performance. For example, the performance of an output circuit may be characterized for different settings of the adjustable capacitor(s) at different frequencies and/or different transmit power levels. The setting that provides the best performance at each frequency and/or each transmit power level of interest may be stored in a look-up table. The characterization may be performed by computer simulation, lab measurements, factory measurements, field measurements, etc. Thereafter, the setting that can provide good performance at a target operating frequency and/or a target transmit power level may be obtained from the look-up table and applied to the output circuit.

Figure 6:
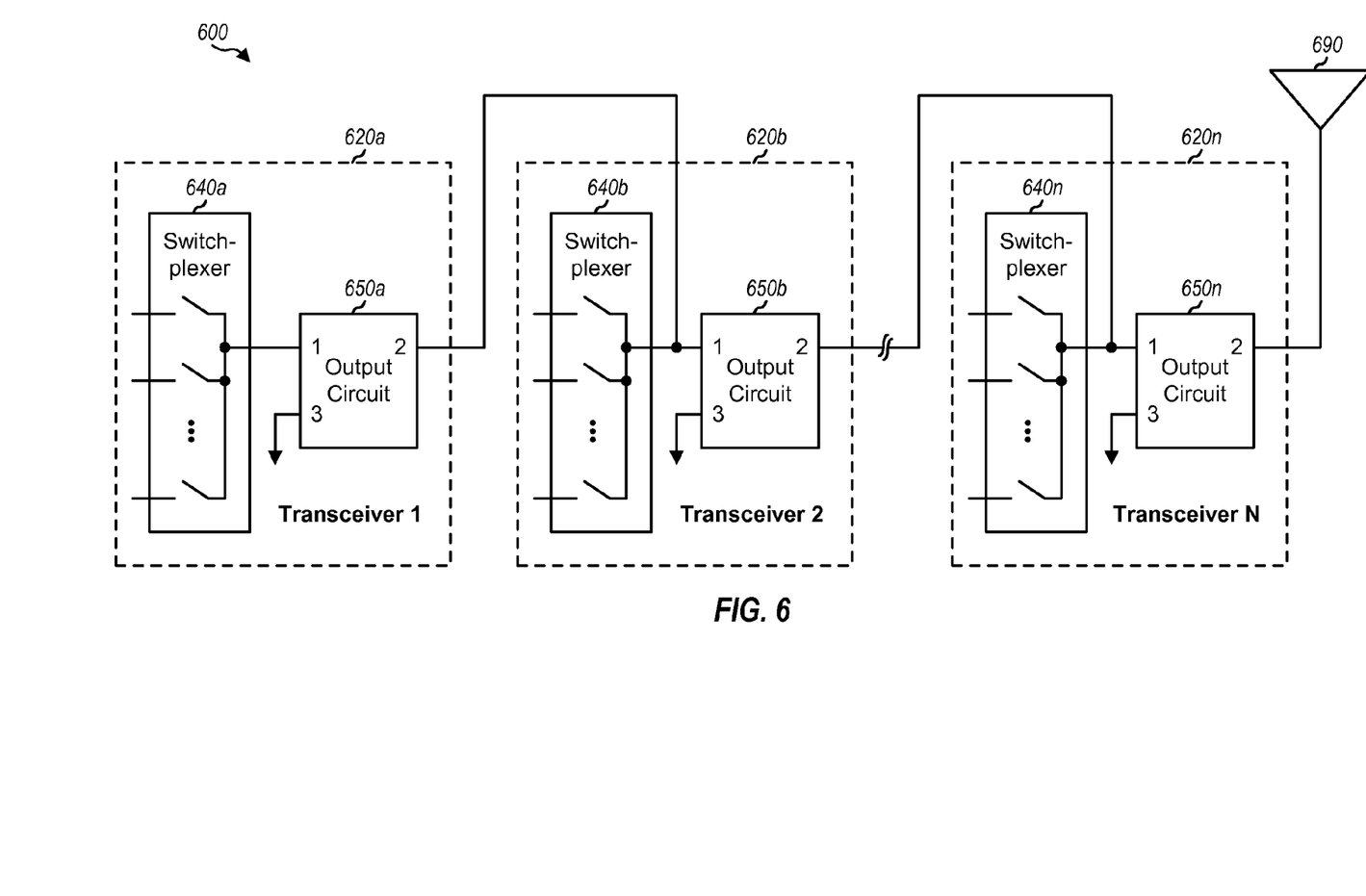
FIG. 6 shows a wireless device with multiple output circuits connected in a daisy chain.

FIG. 6 shows an exemplary design of a wireless device 600 with multiple output circuits connected in a daisy chain. In this exemplary design, wireless device 600 includes N transceivers 620a to 620n, where N may be any integer value greater than one. Each transceiver 620 includes a switchplexer 640 coupled to port 1 of an output circuit 650. Each output circuit 650 may be implemented based on any of the exemplary designs described above or in other manners. In the exemplary design shown in FIG. 6, transceivers 620a to 620n are arranged in a sequential order, and port 2 of output circuit 650 in one transceiver 620 is coupled to port 1 of output circuit 650 in the next transceiver 620 in the sequential order. For example, port 2 of output circuit 650a in transceiver 620a is coupled to port 1 of output circuit 650b in the next transceiver 620b. Port 2 of output circuit 650n in the last transceiver 620n is coupled to an antenna 690.

As shown in FIG. 6, multiple output circuits 650a to 650n for multiple transceivers 620a to 620n may be coupled in series in a daisy chain. The daisy chain connection may enable one or more output circuits 650 to be reused for one or more transceivers 620. A given transceiver (e.g., transceiver 620a) may be coupled to antenna 690 via more than one output circuit (e.g., via output circuits 650a to 650n). The daisy chain connection may allow power amplifiers and duplexers to be grouped by band or coarse frequency range, e.g., low band and high band. A matching circuit of an output circuit may then be design independently for each band or each group of bands. For example, an inductor for higher frequencies may be smaller than an inductor for lower frequencies. Furthermore, a directional coupler may be designed independently for each band or each group of bands. For example, a larger mutual inductance between inductors 460 and 462 and larger capacitors 464 and 466 may be used to obtain the same coupling factor (e.g., 20 dB) in low band as in high band.

Figure 7:
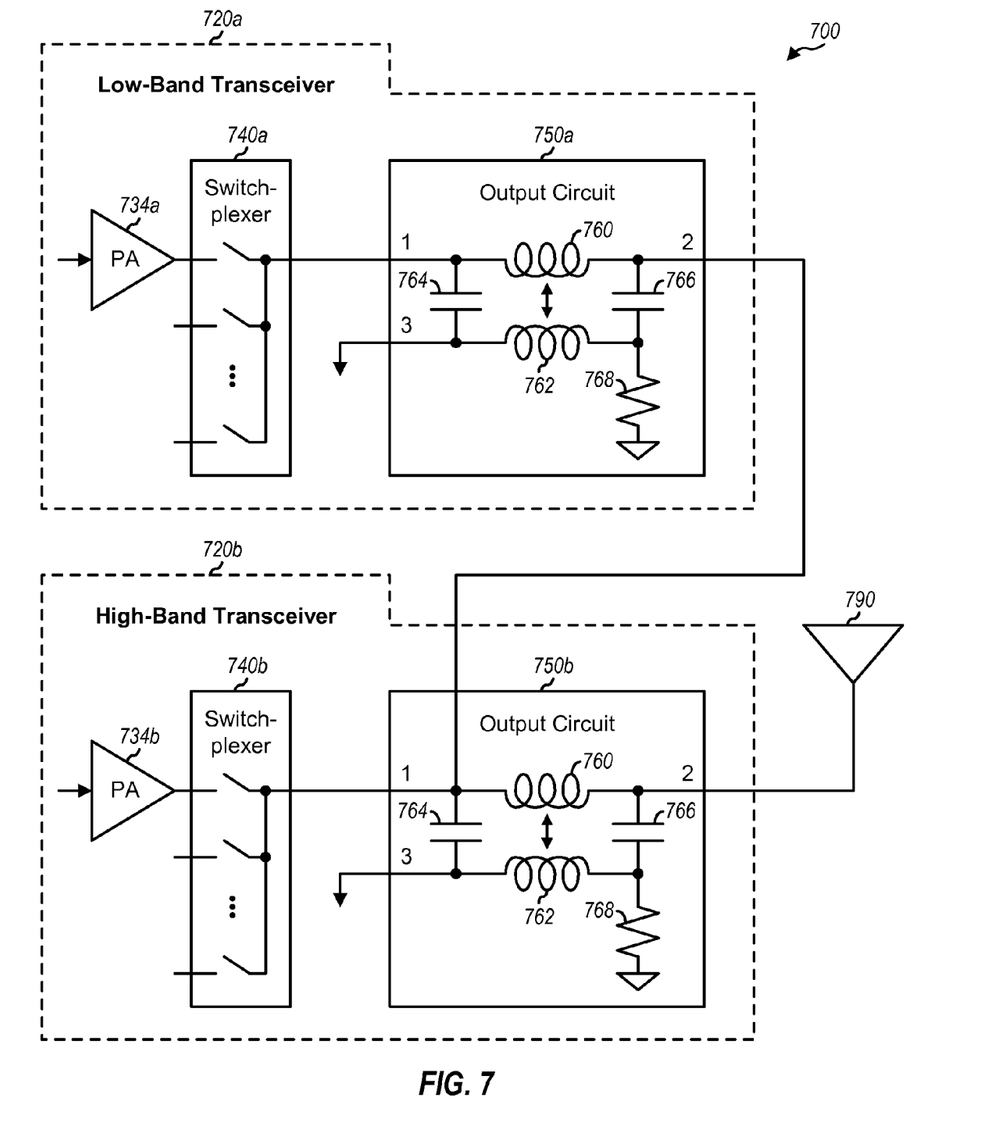
FIG. 7 shows a wireless device with two output circuits connected in a daisy chain.

FIG. 7 shows an exemplary design of a wireless device 700 with two transceivers 720a and 720b and two output circuits 750a and 750b connected in a daisy chain. In this exemplary design, transceiver 720a is designed for low band, and transceiver 720b is designed for high band. Each transceiver 720 includes a switchplexer 740 and an output circuit 750. Each switchplexer 740 may be coupled to a PA 734 and/or other circuits. In the exemplary design shown in FIG. 7, each output circuit 750 is implemented with the 3-port output circuit design shown in FIG. 4B and includes two inductors 760 and 762, two capacitors 764 and 766, and a resistor 768, which are coupled as described above for FIG. 4B. Output circuit 750a in low-band transceiver 720a has its port 1 coupled to switchplexer 740a, its port 2 coupled to port 1 of output circuit 750b in high-band transceiver 720b, and its port 3 providing a coupled RF signal at low band. Output circuit 750b in high-band transceiver 720b has its port 1 coupled to switchplexer 740b, its port 2 coupled to an antenna 790, and its port 3 providing a coupled RF signal at high band.

The inductors, capacitors, and resistors within output circuits 750a and 750b may be selected to provide good performance for low band and high band, respectively. For example, the inductors, capacitors, and resistors may be selected to obtain good performance in terms of insertion loss, return loss, directivity from port 1 to port 2, coupling from port 1 to port 3, target impedance (Z2) at port 2, etc. Computer simulation indicates that good directivity of greater than 20 decibels (dB) can be readily achieved for each circuit 750.

An output circuit may include two coupled inductors to implement a directional coupler and an impedance matching circuit, as described above. The two inductors may be implemented in various manners to obtain the desired inductance and coupling. The two inductors may also be fabricated on one or more conductive layers of an IC, a circuit board, etc.

Figure 8A:
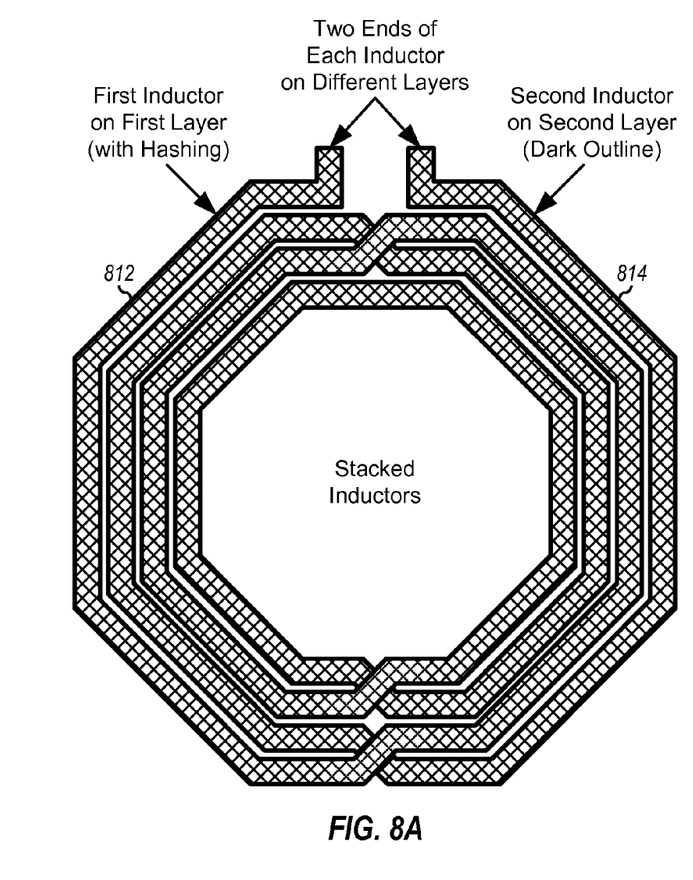
FIGS. 8A and 8B show stacked and side-by-side inductors for an output circuit.

FIG. 8A shows a top view of an exemplary design of two stacked inductors 812 and 814, which may be used in an output circuit. In this exemplary design, inductors 812 and 814 are fabricated on two conductive layers, e.g., of an RFIC or a circuit module. Inductor 812 is implemented with a first conductor arranged in a spiral pattern on a first conductive layer. Inductor 814 is implemented with a second conductor arranged in a spiral pattern on a second conductive layer. The conductor for inductor 814 overlaps the conductor for inductor 812. Inductor 812 is shown with cross hashing, and inductor 814 is shown with dark outline in FIG. 8A.

Figure 8B:
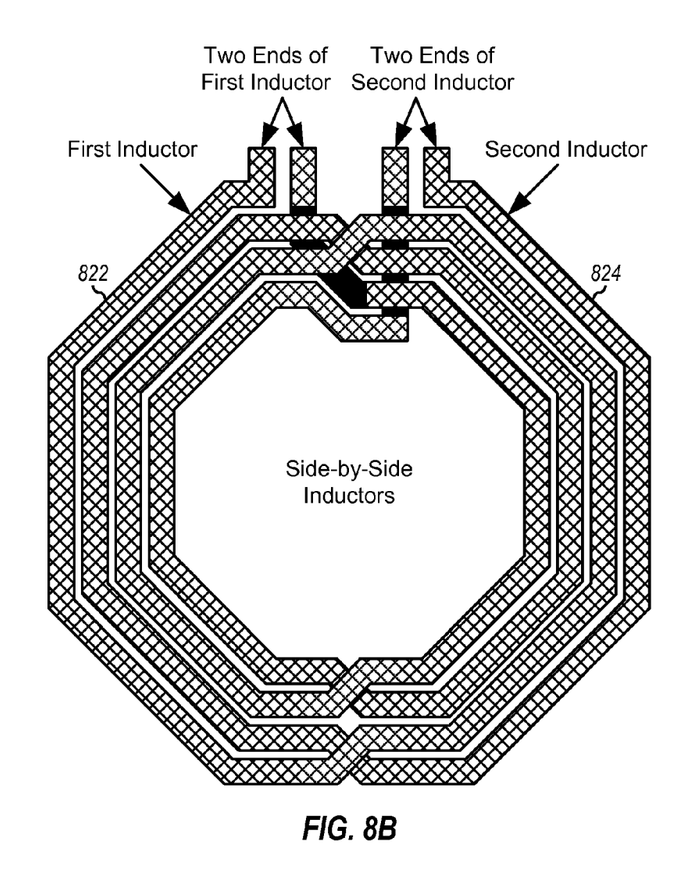

FIG. 8B shows a top view of an exemplary design of two side-by-side inductors 822 and 824, which may also be used in an output circuit. In this exemplary design, inductors 822 and 824 are fabricated on a single conductive layer, e.g., of an RFIC or a circuit module. Inductor 822 is implemented with a first conductor arranged in a spiral pattern on a conductive layer. Inductor 824 is implemented with a second conductor arranged in a spiral pattern on the same conductive layer. The second conductor for inductor 824 is interlaced or interwoven with the first conductor for inductor 822, as shown in FIG. 8B.

FIGS. 8A and 8B show two exemplary designs of two inductors for an output circuit. In general, two inductors in an output circuit may each be implemented with any number of turns. The two inductors may have the same or different numbers of turns. The number of turns, the diameter of the turns, the width and height of each conductor, the spacing between the two conductors for the two inductors, and/or other attributes of the two conductors may be selected to obtain the desired inductance and quality factor (Q) for each inductor as well as the desired coupling coefficient between the two inductors. The coupling coefficient may be varied by controlling the placement of the two conductors and/or the distance between the conductors.

FIGS. 8A and 8B show exemplary designs in which the two inductors are implemented with spiral patterns. The two inductors may also be implemented in other manners such as with a double spiral, zig-zag, or some other pattern. The two inductors may also be fabricated with various conductive materials such as a low-loss metal (e.g., copper), a more lossy metal (e.g., aluminum), or some other material. Higher Q may be achieved for an inductor fabricated on a low-loss metal layer. A smaller-size inductor may be fabricated on a lossy metal layer because different IC design rules may apply.

The stacked topology in FIG. 8A may allow two inductors to be fabricated in a smaller area and may also result in better matching between the two ends of each inductor. The side-by-side topology in FIG. 8B may be used when there is a limited number of metal layers. Actual implementation of the inductors may produce parasitic capacitance between the turns. This parasitic capacitance may be absorbed in capacitors 464 and/or 466, which may then reduce the value of capacitors 464 and/or 466 or may even allow capacitors 464 and/or 466 to be omitted.

Integration of a directional coupler and an impedance matching circuit in a single output circuit may provide various advantages. First, the integration enables an inductor to be reused by both the directional coupler and the impedance matching circuit, which can reduce circuitry, size, and cost and may also improve performance. Second, the integration allows the directional coupler to be placed closer to an antenna, which may enable self-calibration, improve total radiated power control, and provide other advantages In an exemplary design, an apparatus (e.g., a wireless device, an IC, a circuit module, etc.) may comprise an output circuit, e.g., as shown in FIGS. 4A to 5C. In an exemplary design, the output circuit may be coupled to a switchplexer, which may be further coupled to at least one PA. The output circuit may comprise a directional coupler and an impedance matching circuit sharing at least one inductor. For example, the switchplexer may be switchplexer 440 in FIG. 4A, the output circuit may be output circuit 450a, and the at least one PA may include PA 434. The directional coupler may be directional coupler 452a in FIG. 4A, and the impedance matching circuit may be impedance matching circuit 454a. The at least one inductor shared by the directional coupler and the impedance matching circuit may include inductor 460 in FIG. 4B. The output circuit may be coupled between the switchplexer and an antenna.

In an exemplary design, the output circuit may comprise first, second, and third ports. The first port may be coupled to the switchplexer and may receive an input RF signal. The second port may be coupled to a load and may provide an output RF signal. The third port may provide a coupled RF signal comprising a portion of the input RF signal. The output circuit may further comprise a fourth port, which may provide a reflected RF signal received via the second port. In an exemplary design, the load may comprise an antenna, and the output circuit may impedance match the switchplexer and the antenna.

In an exemplary design, the output circuit may comprise first and second inductors. The first inductor (e.g., inductor 460 in FIG. 4B) may be coupled between the first and second ports of the output circuit and may be one of the at least one inductor shared by the directional coupler and the impedance matching circuit. The second inductor (e.g., inductor 462 in FIG. 4B) may be coupled to the third port of the output circuit and may be magnetically coupled to the first inductor. The first and second inductors may be stacked on two layers of an IC or a circuit board (e.g., as shown in FIG. 8A) or formed side-by-side on a single layer (e.g., as shown in FIG. 8B).

The output circuit may further comprise first and second capacitors. The first capacitor (e.g., capacitor 464 in FIG. 4B) may be coupled between a first terminal of the first inductor and a first terminal of the second inductor. The second capacitor (e.g., capacitor 466 in FIG. 4B) may be coupled between a second terminal of the first inductor and a second terminal of the second inductor. The output circuit may further comprise at least one capacitor (e.g., capacitor 470, 472, 474 and/or 476 in FIG. 4C) coupled between at least one terminal of the first inductor and/or at least one terminal of the second inductor and circuit ground. In an exemplary design, the output circuit may comprise fixed capacitors. In another exemplary design, the output circuit may comprise at least one adjustable capacitor to adjust impedance matching, e.g., based on operating frequency and/or transmit power level of the wireless device. The output circuit may further comprise a resistor (e.g., resistor 468 in FIG. 4B) coupled between the second terminal of the second inductor and circuit ground.

In an exemplary design, the apparatus may further comprise a second output circuit. In an exemplary design, the second output circuit may be coupled to a second switchplexer, which may be further coupled to at least one additional power amplifier. The second output circuit may also be coupled to the output circuit and may comprise a second directional coupler and a second impedance matching circuit sharing at least one additional inductor. For example, the switchplexer may be switchplexer 740b in FIG. 7, the output circuit may be output circuit 750b, the second switchplexer may be switchplexer 740a, and the second output circuit may be output circuit 750a. The output circuit may comprise a first port coupled to the switchplexer and a second port coupled to the antenna. The second output circuit may comprise a first port coupled to the second switchplexer and a second port coupled to the first port of the output circuit. The at least one additional power amplifier (e.g., PA 734a in FIG. 7) may be coupled to the antenna via the second switchplexer (e.g., switchplexer 740a), the second output circuit (e.g., output circuit 750a), and the output circuit (e.g., output circuit 750b).

In an exemplary design, the at least one power amplifier, the switchplexer, and the output circuit may be for high band, as shown in FIG. 7. The at least one additional power amplifier, the second switchplexer, and the second output circuit may be for low band, as also shown in FIG. 7.

Figure 9:
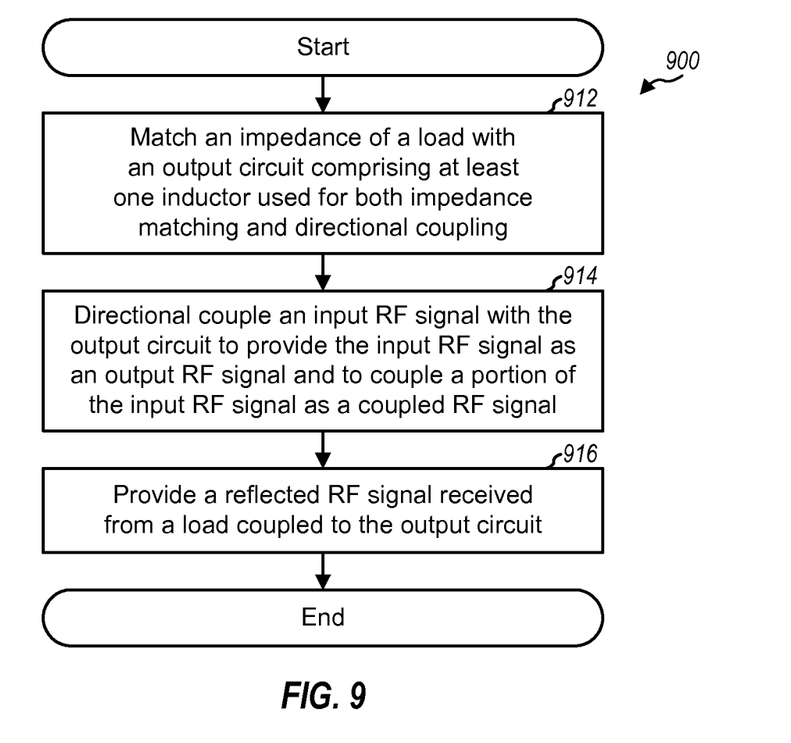
FIG. 9 shows a process of performing impedance matching and directional coupling.

FIG. 9 shows an exemplary design of a process 900 performed by a wireless device. An impedance of a load (e.g., an antenna) may be matched with an output circuit comprising at least one inductor used for both impedance matching and directional coupling (block 912). Directional coupling may be performed with the output circuit to provide an input RF signal as an output RF signal and to couple a portion of the input RF signal as a coupled RF signal (block 914). A reflected RF signal received from the load may be provided by the output circuit (block 916).

In an exemplary design, impedance matching in block 912 and directional coupling in block 914 may be performed with the output circuit at high band. The impedance of the load may be matched at low band with a second output circuit comprising at least one additional inductor used for both impedance matching and directional coupling at low band. Directional coupling at low band may be performed with the second output circuit. In an exemplary design, impedance matching of the load at low band may be performed with both the output circuit and the second output circuit coupled in series, e.g., as shown in FIG. 7.

An output circuit with integrated/combined directional coupler and impedance matching circuit, as described herein, may be implemented on an IC, an analog IC, an RFIC, a mixed-signal IC, an ASIC, a printed circuit board (PCB), an electronic device, etc. An output circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an output circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    an output circuit coupled to a switchplexer, the output circuit comprising a directional coupler and an impedance matching circuit, the directional coupler and the impedance matching circuit sharing at least one inductor used for both directional coupling and to match an impedance of the switchplexer, the output circuit configured to receive an input radio frequency (RF) signal and convey an output RF signal and a reflected RF signal received from a load coupled to the output circuit.

2. The apparatus of claim 1, wherein the switchplexer is coupled to at least one power amplifier and the output circuit.

3. The apparatus of claim 2, wherein the output circuit is coupled between the switchplexer and an antenna.

4. The apparatus of claim 1, the output circuit comprising:
    a first port receiving an input radio frequency (RF) signal;
    a second port providing an output RF signal; and
    a third port providing a coupled RF signal comprising a portion of the input RF signal.

5. The apparatus of claim 4, the output circuit further comprising:
    a fourth port providing a reflected RF signal received via the second port.

6. The apparatus of claim 4, wherein the output circuit appears inductive looking into the first port.

7. The apparatus of claim 4, the output circuit impedance matching an antenna coupled to the second port of the output circuit.

8. The apparatus of claim 1, the output circuit comprising:
    a first inductor coupled between a first port and a second port of the output circuit, the first inductor being one of the at least one inductor shared by the directional coupler and the impedance matching circuit; and
    a second inductor coupled to a third port of the output circuit and being magnetically coupled to the first inductor.

9. The apparatus of claim 8, the output circuit further comprising:
    a first capacitor coupled between a first terminal of the first inductor and a first terminal of the second inductor; and
    a second capacitor coupled between a second terminal of the first inductor and a second terminal of the second inductor.

10. The apparatus of claim 8, the output circuit further comprising:
    at least one capacitor coupled between at least one terminal of the first inductor or at least one terminal of the second inductor and circuit ground.

11. The apparatus of claim 8, the output circuit further comprising:
    a resistor coupled between a terminal of the second inductor and circuit ground.

12. The apparatus of claim 8, wherein the first and second inductors are stacked on two layers of an integrated circuit or a circuit board or formed side-by-side on a single layer of the integrated circuit or the circuit board.

13. The apparatus of claim 1, the output circuit comprising:
    at least one adjustable capacitor to adjust impedance matching.

14. The apparatus of claim 1, further comprising:
    a second output circuit coupled to the output circuit, the second output circuit comprising a second directional coupler and a second impedance matching circuit sharing at least one additional inductor.

15. The apparatus of claim 14, the output circuit comprising a first port coupled to a switchplexer and a second port coupled to an antenna, and the second output circuit comprising a first port coupled to a second switchplexer and a second port coupled to the first port of the output circuit.

16. The apparatus of claim 15, wherein the switchplexer and the output circuit are for high band, and wherein the second switchplexer and the second output circuit are for low band.

17. A method comprising:
    matching an impedance of a load of a switchplexer using an output circuit comprising a directional coupler and an impedance matching circuit, the impedance matching circuit comprising at least one inductor; and
    directional coupling, using at least the at least one inductor, an input radio frequency (RF) signal with the output circuit to provide the input RF signal as an output RF signal, to provide a reflected RF signal received from the load, and to couple a portion of the input RF signal as a coupled RF signal.

18. The method of claim 17, further comprising:
    providing a reflected RF signal received from a load coupled to the output circuit.

19. An apparatus comprising:
    means for matching an impedance of a load of a switchplexer, the means for matching an impedance comprising at least one inductor; and
    means for directional coupling an input radio frequency (RF) signal, using at least the at least one inductor, to provide the input RF signal as an output RF signal, to provide a reflected RF signal received from the load coupled to the means for matching impedance and the means for directional coupling, and to couple a portion of the input RF signal as a coupled RF signal.

* * * * *